United States Patent
Hsueh et al.

(10) Patent No.: US 8,847,321 B2
(45) Date of Patent: Sep. 30, 2014

(54) CASCODE CMOS STRUCTURE

(75) Inventors: Fu-Lung Hsueh, Cranbury, NJ (US); Chih-Ping Chao, Juhdong Town (TW); Chewn-Pu Jou, Hsinchu (TW); Yung-Chow Peng, Hsinchu (TW); Harry-Hak-Lay Chuang, Hsinchu (TW); Kuo-Tung Sung, Zhudong Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 430 days.

(21) Appl. No.: 12/766,972

(22) Filed: Apr. 26, 2010

(65) Prior Publication Data

US 2011/0215420 A1 Sep. 8, 2011

Related U.S. Application Data

(60) Provisional application No. 61/310,853, filed on Mar. 5, 2010.

(51) Int. Cl.
*H01L 29/78* (2006.01)
*G06F 17/50* (2006.01)
*H01L 27/088* (2006.01)

(52) U.S. Cl.
CPC ............ *G06F 17/50* (2013.01); *H01L 27/088* (2013.01)
USPC .................... 257/365; 257/391; 257/E29.275

(58) Field of Classification Search
CPC .................. H01L 29/78645; H01L 29/42376
USPC ................... 257/391, 392, 401, E29.275, 365
See application file for complete search history.

(56) References Cited

U.S. PATENT DOCUMENTS

| | | | | |
|---|---|---|---|---|
| 4,600,933 A * | 7/1986 | Richman | | 257/391 |
| 5,789,791 A * | 8/1998 | Bergemont | | 257/401 |
| 6,611,025 B2 * | 8/2003 | Lin | | 257/355 |
| 7,274,075 B2 * | 9/2007 | Yaegashi | | 257/391 |
| 7,750,417 B2 * | 7/2010 | Iino et al. | | 257/392 |
| 7,928,809 B2 * | 4/2011 | Miyashita | | 331/108 C |
| 8,029,873 B2 * | 10/2011 | Ikeda et al. | | 427/569 |
| 2005/0189595 A1 * | 9/2005 | Okamoto et al. | | 257/368 |
| 2008/0121997 A1 * | 5/2008 | Yang et al. | | 257/365 |
| 2009/0114971 A1 * | 5/2009 | Cai et al. | | 257/315 |
| 2009/0212854 A1 * | 8/2009 | Baumgartner | | 327/543 |

FOREIGN PATENT DOCUMENTS

CN 101431078 A 5/2009

OTHER PUBLICATIONS

Kwok Ng, Complete Guide to Semiconductor Devices, 2002, John Wiley & Sons, Second Edition, pp. 175-177.*
S.M. Sze, Physics of Semiconductor Devices, 1981, John Wiley & Sons, Second Edition, pp. 366-371.*

* cited by examiner

*Primary Examiner* — Jerome Jackson, Jr.
*Assistant Examiner* — Paul Budd
(74) *Attorney, Agent, or Firm* — Duane Morris LLP

(57) ABSTRACT

A MOS device includes an active area having first and second contacts. First and second gates are disposed between the first and second contacts. The first gate is disposed adjacent to the first contact and has a third contact. The second gate is disposed adjacent to the second contact and has a fourth contact coupled to the third contact. A transistor defined by the active area and the first gate has a first threshold voltage, and a transistor defined by the active area and the second gate has a second threshold voltage.

11 Claims, 5 Drawing Sheets

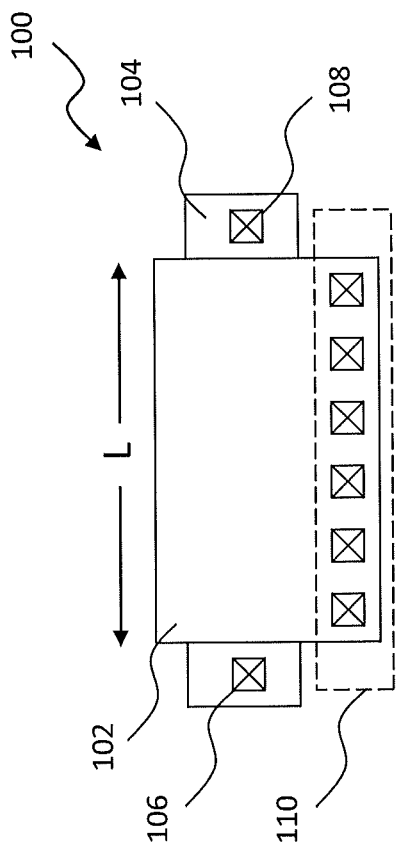
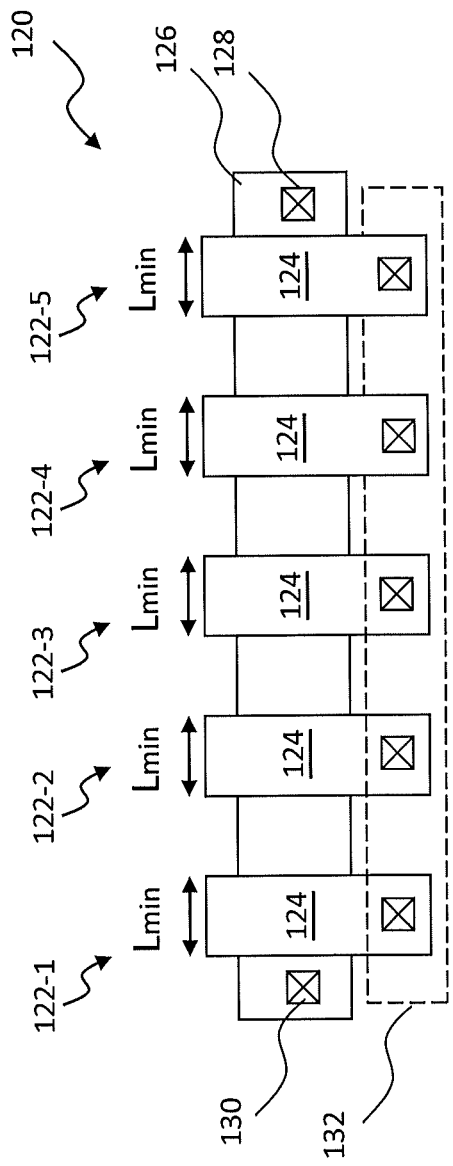
FIG. 1A (PRIOR ART)
FIG. 1B (PRIOR ART)

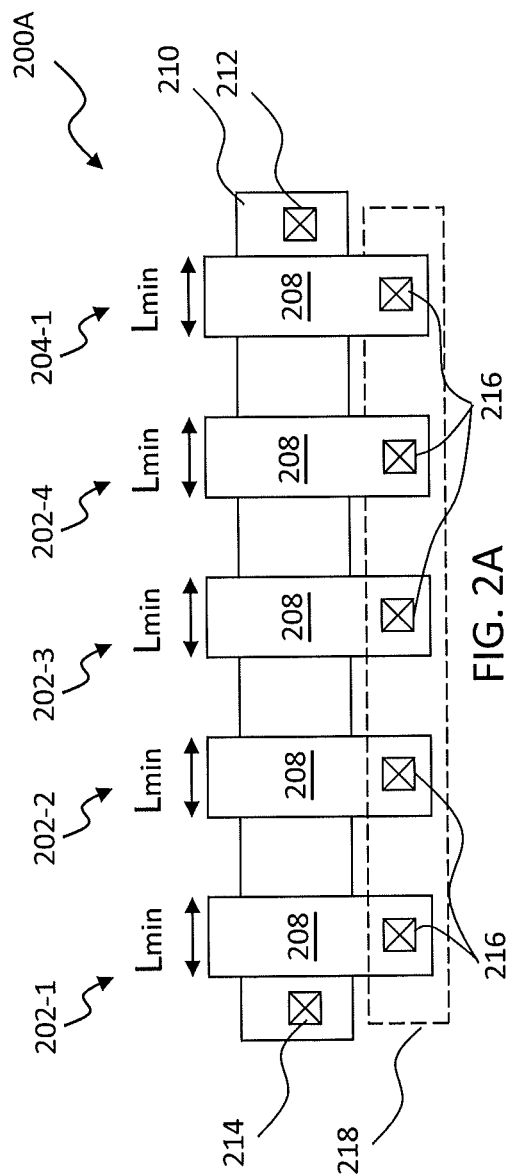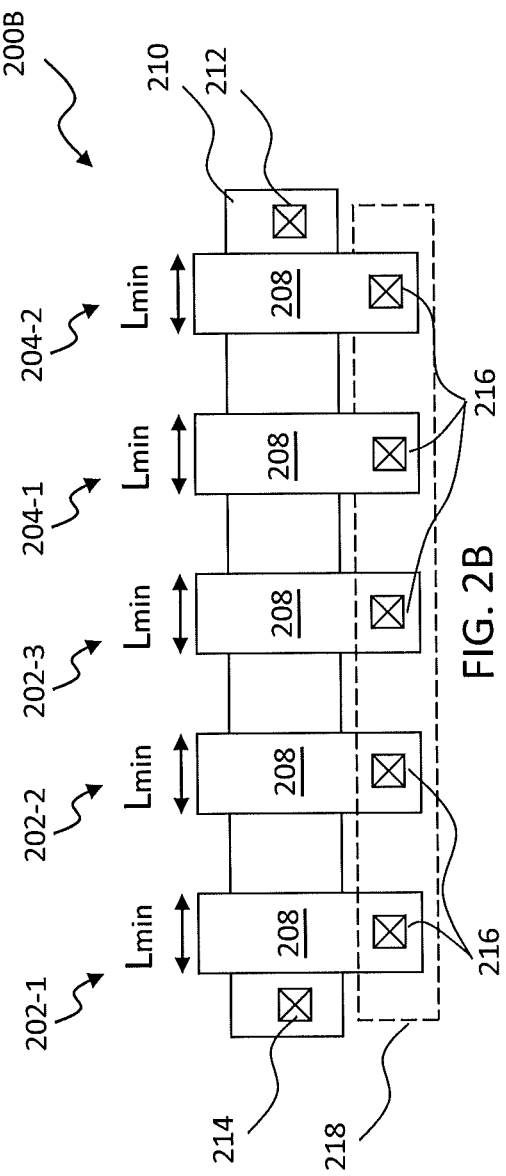

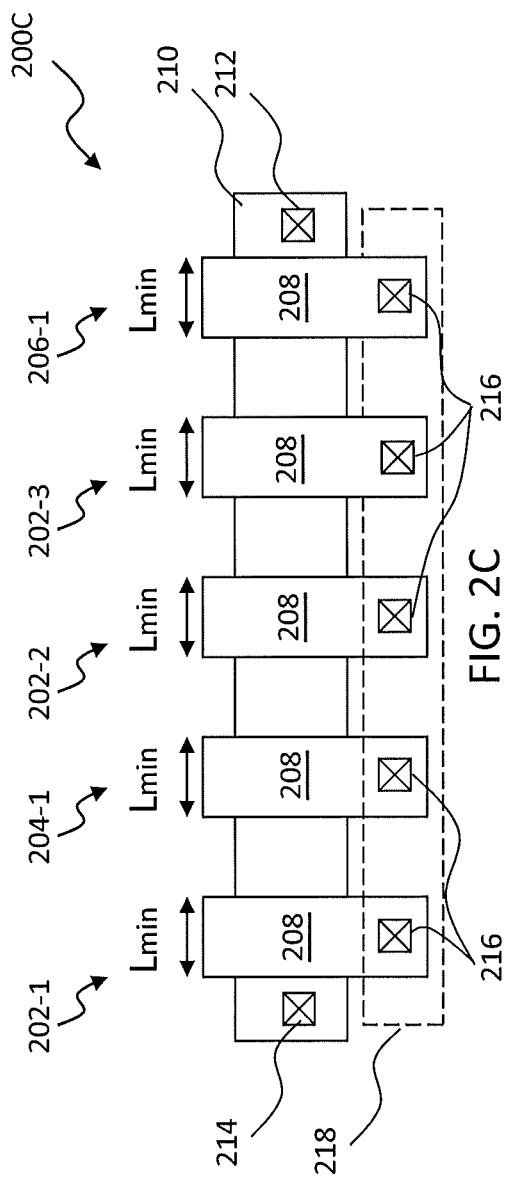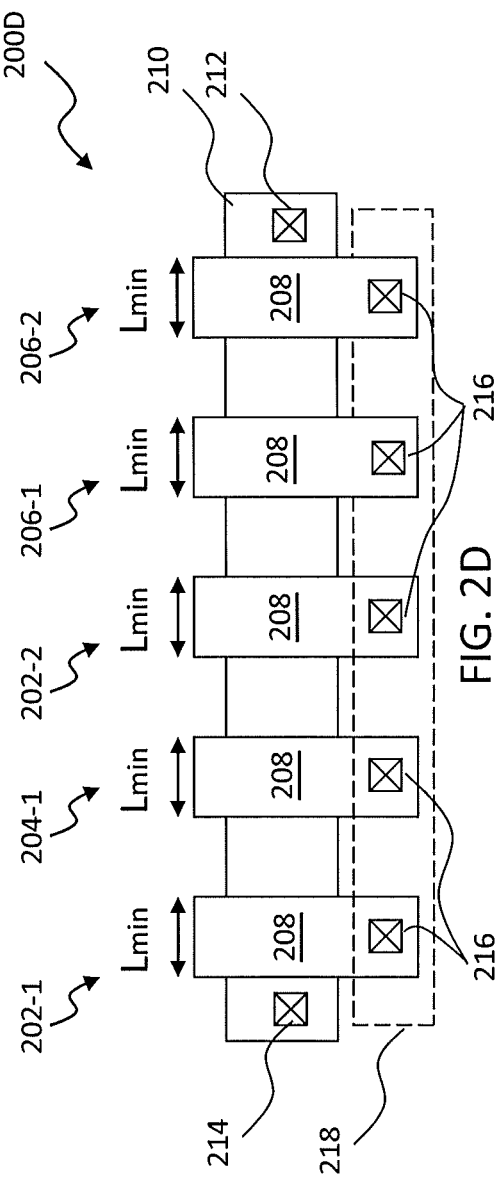

CASCODE CMOS STRUCTURE

CROSS-REFERENCE TO RELATED APPLICATIONS

This application claims priority to U.S. Provisional Patent Application No. 61/310,853 filed Mar. 5, 2010, the entirety of which is herein incorporated by reference.

FIELD OF DISCLOSURE

The disclosed system and method relate to integrated circuits. More specifically, the disclosed system and method relate to integrated circuit devices having large gate widths formed using complementary metal oxide semiconductor (CMOS) technology.

BACKGROUND

In accordance with the International Technology Roadmap for Semiconductors (ITRS), technology nodes below 40 nm have fixed polysilicon (poly) patterns having fixed pitches or uni-direction poly patterns for the manufacturing of metal oxide semiconductor (MOS) devices. These fixed poly pitch patterns for technology nodes smaller than 40 nm preclude large continuous lengths of poly. This restraint on large poly width dimensions is problematic in many analog circuits based on MOS devices, which require large gate-source resistances for providing large gains.

Accordingly, an improved design for MOS devices is desirable.

SUMMARY

A MOS device is disclosed that includes an active area having first and second contacts. First and second gates are disposed between the first and second contacts. The first gate is disposed adjacent to the first contact and has a third contact. The second gate is disposed adjacent to the second contact and has a fourth contact coupled to the third contact. A transistor defined by the active area and the first gate has a first threshold voltage, and a transistor defined by the active area and the second gate has a second threshold voltage.

A method is also disclosed in which an initial model of a MOS device is provided. The MOS device includes a gate having a gate contact disposed over an active area including first and second contacts. A final model of the MOS device is created based on the initial model such that in the final model the gate of the MOS device includes a plurality of fingers each having a respective gate contact. Each of the fingers respectively defines a transistor with the active area. A first one of the transistors has a first threshold voltage, and a second one of the transistors has a second threshold voltage. The final model of the MOS device is stored in a computer readable storage medium.

BRIEF DESCRIPTION OF THE DRAWINGS

FIG. 1A is a layout view of a conventional MOS device.
FIG. 1B is a layout view of an equivalent MOS device including a plurality of fingers.
FIGS. 2A-2D are layout views of improved MOS devices including a plurality of fingers.

DETAILED DESCRIPTION

Figure 3:
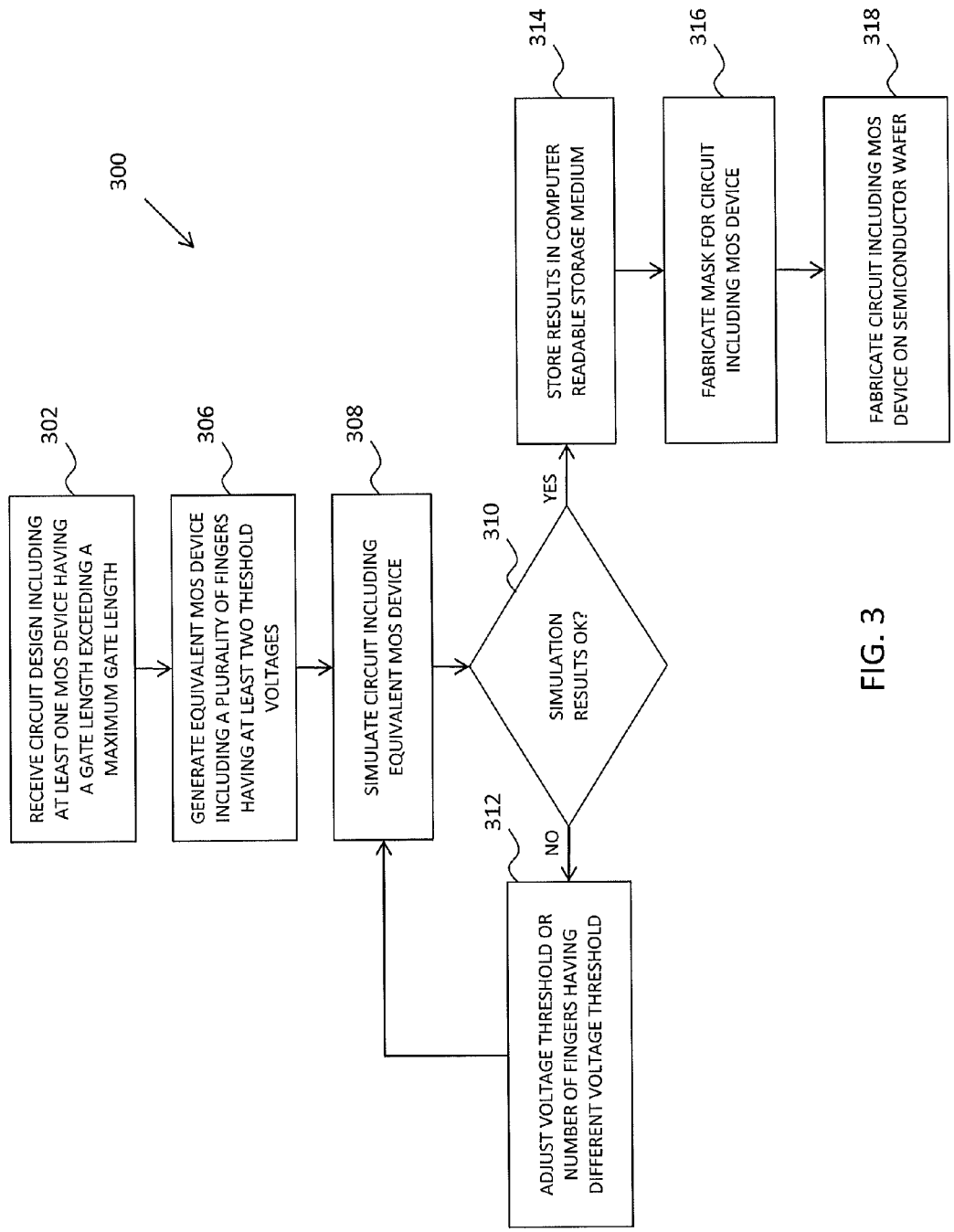
FIG. 3 is a flow diagram of one example of a method of designing an improved multi-finger MOS device.

The improved method and layout of MOS devices disclosed herein enables the fabrication of MOS devices having gate lengths exceeding a maximum allowed pitch pattern to be fabricated while maintaining consistent operating characteristics.

FIG. 1A illustrates a MOS device 100 including a gate 102 having a length, L, formed over an active area 104. Contact 106 may be a drain contact, contact 108 may be a source contact, and contacts 110 are coupled together to form a gate contact for connecting to other devices. Conventionally, if the gate length of MOS device 100 exceeds a maximum pitch length as set forth by the ITRS for a certain technology node, e.g., a 1 μm gate length for 28 nm technology, then the MOS device is fabricated using a plurality of fingers, e.g., 10 fingers each having a gate length of 100 nm. FIG. 1B illustrates a MOS device 120 having five fingers 122-1:122-5 (collectively referred to as "fingers 122") coupled in a cascode, which have a total gate length that is equal to the gate length, L, of MOS device 100. Each of the fingers 122 includes a gate 124 having a length, $L_{min}$, which is an equal fraction of the length, L, of gate 102, e.g., $L_{min}$ is equal to L/5. Gates 124 are formed over active area 126 having a first contact 128 at one end and a second contact 130 at the other end. Contacts 132 are gate contacts, which may be coupled together and to other devices for turning on and off each of the fingers 122. Each of the gates 124 defines a transistor in combination with the active area 126 and the first and second contacts 128, 130, which may be a source contact and a drain contact, respectively. Each of the transistors is formed such that they each have the same threshold voltage.

However, fingers 122 may not turn on and off at the same time due to variations across the MOS device 120, which may cause detrimental performance in the circuit in which the MOS device 120 is incorporated. For example, assuming the voltage at contact 130 is greater than the voltage at contact 128, e.g., $V_s > V_d$, then the source voltage of finger 122-1 is greater than the source voltage of finger 122-2, which has a greater source voltage than finger 122-3, and so on such that finger 122-5 has the highest source voltage and finger 122-1 has the lowest source voltage. The variations in source voltages across MOS device 120 is due to the voltage drop across each of the gates 124 and results in finger 122-1 having a higher incidence of drain-to-source breakdown.

FIG. 2A-2D illustrate various embodiments of an improved layout of a MOS device 200. MOS device 200 in FIG. 2A includes a plurality of fingers 202-1:202-4 and 204-1 (collectively referred to as "fingers 202, 204") having a gate 208 formed over active area 210. Contacts 212 and 214 may be source and drain contacts of MOS device 200, respectively, although one skilled in the art will understand that contact 212 may be the drain contact and contact 214 may be the source contact. Contacts 216 of fingers 202, 204 are tied together by a conductive layer 218 and collectively form the gate contact of MOS device 200.

Unlike MOS devices fabricated from a plurality of fingers in which each of the fingers has the same threshold voltages, $V_{th}$, MOS device 200A includes fingers 202, 204 having differing threshold voltages. For example, fingers 202 may have a first threshold voltage, $V_{th\text{-}202}$, and finger 204-1 may have a second threshold voltage, $V_{th\text{-}204}$, which is lower than the threshold voltage $V_{th202}$, if contact 214 is the source contact. The threshold voltage of any of fingers 202, 204 may be adjusted by varying the doping concentration of the channel beneath the gates of the fingers. For example, the channel in active area 210 may have higher doping concentrations beneath the gates 208 of fingers 202, and a lower doping concentration beneath the gates 208 of finger 204. Additionally or alternatively, the gate oxide thickness of fingers 202, 204 may be adjusted to vary the threshold voltages. Implementing MOS device 200A with a plurality of fingers 202, 204 with different threshold voltages, $V_{th-202}$, $V_{th-204}$ advantageously reduces the drain-to-source breakdown of the fingers 202, 204.

The number of fingers and threshold voltages of each of the fingers in a MOS device may be varied. For example, FIG. 2B illustrates an embodiment in which MOS device 200B includes three fingers 202-1:202-3 having one threshold voltage, $V_{th-202}$, and two fingers 204-1, 204-2 having another threshold, $V_{th-204}$. Fingers 204-1, 204-2 may be disposed adjacent to drain contact 212 and have a lower threshold voltage than transistors 204-1:204-3. FIG. 2C illustrates another embodiment in which MOS device 200C includes three fingers 202-1:202-3 having a first threshold voltage, $V_{th-202}$, one finger 204-1 having a second threshold voltage, $V_{th-204}$, and another finger 206-1 having a third threshold voltage, $V_{th-206}$. Threshold voltage $V_{th-202}$ may be greater than threshold voltage $V_{th-204}$, which may be greater than threshold voltage $V_{th-206}$. FIG. 2D illustrates another embodiment in which MOS device 200D includes five fingers with two fingers 202-1, 202-2 having a first voltage threshold, $V_{th-202}$, one finger 204-1 having a second voltage threshold, $V_{th-204}$, and two fingers 206-1, 206-2 having a third voltage threshold, $V_{th-206}$. One skilled in the art will understand that the number of fingers and number of threshold voltages are not limited.

The design and fabrication of the improved MOS device is described with reference to FIG. 3. As shown in FIG. 3, a circuit design including at least one MOS device having a gate length that exceeds a maximum poly pattern pitch of a technology node is received at block 302. At block 304, the MOS device having gate length, L, is divided into a plurality of fingers each having a gate length, $L_{min}$, and at least two threshold voltages. As described above, each of the fingers may have a gate length, $L_{min}$, that is an equal fraction of the gate length, L. For example, if gate length, L, of the MOS device is 1 μm, then the MOS device may be divided into 10 fingers each having a gate length, $L_{min}$, equal to 100 nm for a 28 nm technology node.

Figure 4:
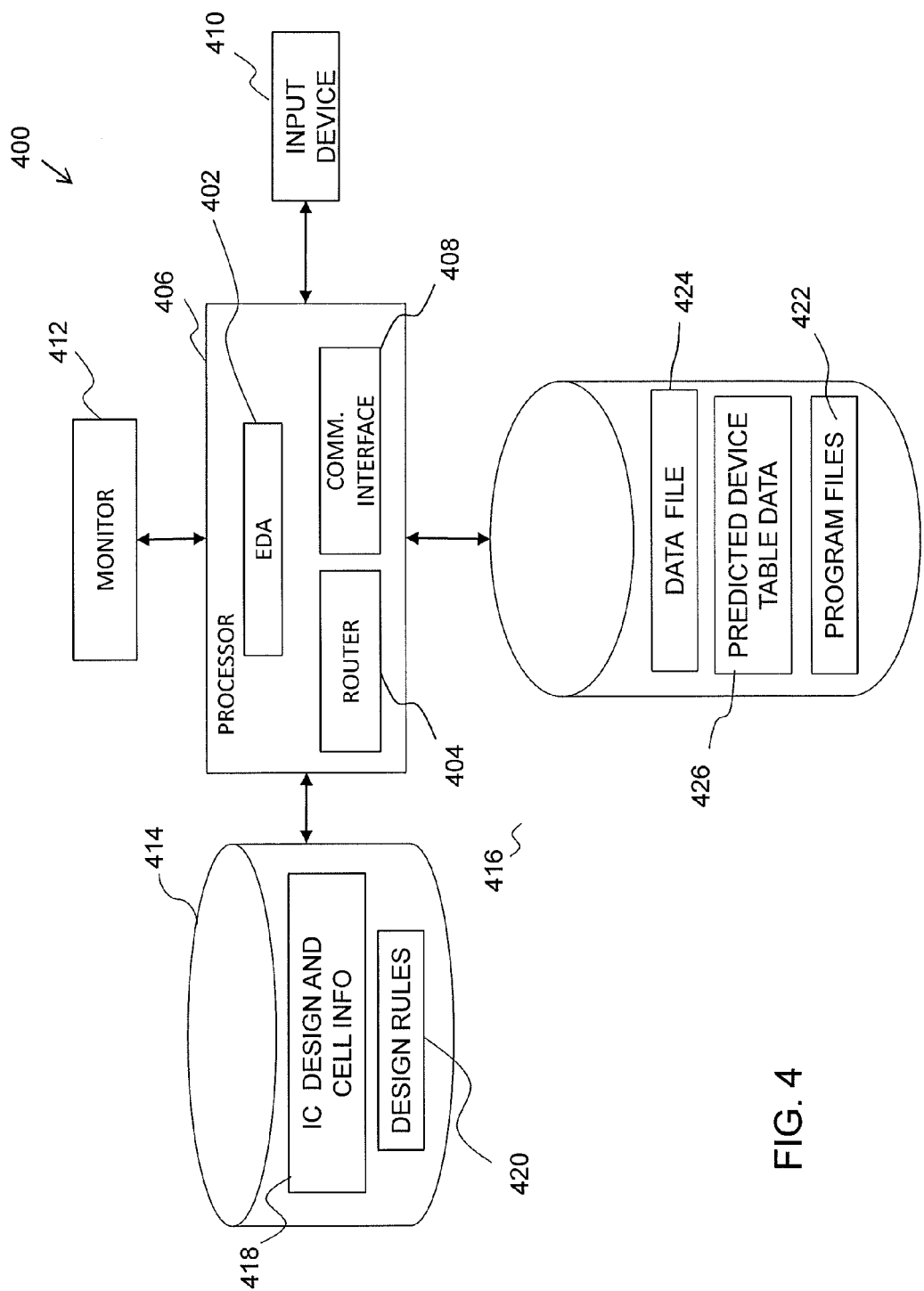
FIG. 4 is a block diagram of one example of a system for simulating an improved multi-finger MOS device.

A simulation of the circuit including the MOS device having a plurality of fingers is performed at block 306. The simulation may be performed using a simulation program with integrated circuit emphasis (SPICE) that may be run on a system 400 as illustrated in FIG. 4. As shown in FIG. 4, the system 400 may include an electronic design automation tool 402 such as "IC COMPILER"™, sold by Synopsis, Inc. of Mountain View, Calif., having a router 404 such as "ZROUTE"™, also sold by Synopsis. Other EDA tools 402 may be used, such as, for example, the "VIRTUOSO" custom design platform or the Cadence "ENCOUNTER"® digital IC design platform along with the "VIRTUOSO" chip assembly router 404, all sold by Cadence Design Systems, Inc. of San Jose, Calif.

The EDA tool 402 is a special purpose computer formed by retrieving stored program instructions 422 from a computer readable storage mediums 414, 416 and executing the instructions on a general purpose processor 406. Processor 406 may be any central processing unit (CPU), microprocessor, microcontroller, or computational device or circuit for executing instructions. Processor 606 may be configured to perform circuit simulations based on a plurality of data stored in the one or more computer readable storage mediums 414, 416.

The computer readable storage medium 414, 416 may include one or more of registers, a random access memory (RAM) and/or a more persistent memory, such as a ROM. Examples of RAM include, but are not limited to, SRAM or dynamic random-access memory (DRAM). A ROM may be implemented as a programmable read-only memory (PROM), an erasable programmable read-only memory (EPROM), an electrically erasable programmable read-only memory (EEPROM), magnetic or optical storage media, as will be understood by one skilled in the art.

System 400 may include a monitor 410 and a user interface or input device 412 such as, for example, a mouse, a touch screen, a microphone, a trackball, a keyboard, or like device through which a user may input design instructions and/or data. The one or more computer readable storage mediums 414, 416 may store data input by a user, design rules 420, IC design and cell information 418, and data files 426, such as GDSII files, representing a physical layout of a circuit. Computer readable storage mediums 414, 416 may also store various transistor models in a variety of formats including, but not limited to, BSIM3, BSIM4, PSP, and HiSIM to name a few.

EDA tool 402 may include a communication interface 408 allowing software and data to be transferred between EDA tool 402 and external devices. Example communications interfaces 408 include, but are not limited to, modems, Ethernet cards, wireless network cards, Personal Computer Memory Card International Association (PCMCIA) slots and cards, or the like. Software and data transferred via communications interface 408 may be in the form of signals, which may be electronic, electromagnetic, optical, or the like that are capable of being received by communications interface 408. These signals may be provided to communications interface 408 via a communication path (e.g., channel), which may be implemented using wire, cable, fiber optics, a telephone line, a cellular link, a radio frequency (RF) link, to name a few.

The router 404 is capable of receiving an identification of a plurality of circuit components to be included in an integrated circuit (IC) layout including a list of pairs of cells, macro blocks or I/O pads within the plurality of circuit components to be connected to each other. A set of design rules 420 may be used for a variety of technology nodes (e.g., technology greater than, less than, or equal to 40 nm). In some embodiments, the design rules 420 configure the router 404 to locate connecting lines and vias on a manufacturing grid. One or more plots of data may be displayed to a user of the system 400 on a monitor 412.

At decision block 310, the results of the simulation are reviewed to determine if the MOS device including the plurality of fingers performs suitably. For example, the simulation results may identify the breakdown voltages of each of the plurality of fingers of the MOS device. If the simulation results are not suitable, then the method proceeds to block 312 where the threshold voltage of one or more of the fingers of the MOS device is adjusted. The circuit is simulated again at block 308. One of ordinary skill in the art will appreciate that the loop including steps 308, 310, and 312 may be executed any number of times, until a desired operation of each of the fingers of the MOS device is achieved. This iteration can be performed by a computer repeatedly determining the breakdown voltages of each of the fingers of the MOS device for a plurality of different transistor adjustments, so that an acceptable multi-finger MOS device can be achieved on a first iteration on actual silicon.

If the simulation of the circuit including the MOS device indicates the configuration is acceptable, then the results of the simulation and/or parameters of the circuit including the MOS device are stored in a computer readable storage medium at block 314. At block 316, the masks for the circuit including the multi-finger MOS device are developed. The circuit including the multi-finger MOS device may then be fabricated at block 318.

In other examples, following generation of a mask set and fabrication of a substrate including the MOS device, additional adjustments can be made using the method of FIG. 3, by inputting the design used in silicon as the input design in FIG. 3.

The present invention may include one or more components in the form of computer-implemented processes and apparatus for practicing those processes. These components may also be embodied in the form of computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for practicing the invention. These components may also be embodied in the form of computer program code loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The components may alternatively be embodied in a digital signal processor formed of application specific integrated circuits for performing a method according to the principles described herein.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. A MOS device, comprising:
   an active area including a first contact that forms a source contact for the MOS device and a second contact that forms a drain contact for the MOS device, the MOS device being a transistor comprising a plurality of fingers;
   first and second gates disposed between the first and second contacts, the first gate associated with a first finger and being disposed adjacent to the first contact and having a third contact, the second gate associated with a second finger and being disposed adjacent to the second contact and having a fourth contact that is tied to the third contact such that the third and fourth contacts form a gate contact of the MOS device; and
   a plurality of gates formed over the active area between the first gate and the second gate,
   wherein the first finger defined by the active area and the first gate has a first threshold voltage provided by a first gate oxide thickness, and the second finger defined by the active area and the second gate has a second threshold voltage provided by a second gate oxide thickness such that the second threshold voltage is different than the first threshold voltage, and
   wherein a first subset of the fingers defined by the active area and the plurality of gates between the first and second gates have the first threshold voltage, and a second subset of the fingers defined by the active area and the plurality of gates between the first and second gates have the second threshold voltage.

2. The MOS device of claim 1, wherein the first threshold voltage is higher than the second threshold voltage.

3. The MOS device of claim 1, wherein each of the plurality of gates disposed between the first and second gates defines a respective finger with the active area.

4. The MOS device of claim 3, wherein each of the fingers defined by the active area and the plurality of gates between the first and second gates have the first threshold voltage.

5. The MOS device of claim 1, wherein each of the fingers defined by the active area and the plurality of gates between the first and second gates have the second threshold voltage.

6. The MOS device of claim 1, wherein a third subset of the fingers defined by the active area and the plurality of gates between the first and second gates have a third threshold voltage.

7. The MOS device of claim 1, wherein each of the fingers defined by the active area and the plurality of gates between the first and second gates have the second threshold voltage.

8. A MOS device, comprising:
   an active area including a first contact that forms a source contact for the MOS device and a second contact that forms a drain contact for the MOS device, the MOS device being a transistor comprising a plurality of fingers;
   first and second gates disposed between the first and second contacts, the first gate associated with a first finger and being disposed adjacent to the first contact and having a third contact, the second gate associated with a second finger and being disposed adjacent to the second contact and having a fourth contact that is tied to the third contact such that the third and fourth contacts form a gate contact of the MOS device; and
   a plurality of gates formed over the active area between the first gate and the second gate,
   wherein the first finger defined by the active area and the first gate has a first threshold voltage provided by a first gate oxide thickness, and the second finger defined by the active area and the second gate has a second threshold voltage provided by a second gate oxide thickness such that the second threshold voltage is different than the first threshold voltage,
   wherein a first subset of the fingers defined by the active area and the plurality of gates between the first and second gates have the first threshold voltage, and a second subset of the fingers defined by the active area and the plurality of gates between the first and second gates have the second threshold voltage, and
   wherein a third subset of the fingers defined by the active area and the plurality of gates between the first and second gates have a third threshold voltage.

9. The MOS device of claim 8, wherein the first threshold voltage is higher than the second threshold voltage.

10. The MOS device of claim 8, wherein each of the plurality of gates disposed between the first and second gates defines a respective finger with the active area.

11. The MOS device of claim 10, wherein each of the fingers defined by the active area and the plurality of gates between the first and second gates have the first threshold voltage.

* * * * *